(12) United States Patent
Lee

(10) Patent No.: US 10,475,801 B2
(45) Date of Patent: Nov. 12, 2019

(54) FERROELECTRIC MEMORY DEVICE AND CROSS-POINT ARRAY APPARATUS INCLUDING THE SAME

(71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/861,055

(22) Filed: Jan. 3, 2018

(65) Prior Publication Data

US 2018/0269216 A1 Sep. 20, 2018

(30) Foreign Application Priority Data

Mar. 15, 2017 (KR) ........................ 10-2017-0032719

(51) Int. Cl.
*H01L 27/11502* (2017.01)
*H01L 45/00* (2006.01)
*G11C 13/00* (2006.01)
*G11C 11/22* (2006.01)
*H01L 27/24* (2006.01)
*H01L 27/11507* (2017.01)
*H01L 49/02* (2006.01)

(52) U.S. Cl.
CPC ........ *H01L 27/11502* (2013.01); *G11C 11/22* (2013.01); *G11C 13/0069* (2013.01); *H01L 27/2418* (2013.01); *H01L 27/2463* (2013.01); *H01L 45/00* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/1616* (2013.01); *H01L 45/1625* (2013.01); *G11C 2213/54* (2013.01); *H01L 27/11507* (2013.01); *H01L 28/55* (2013.01)

(58) Field of Classification Search
CPC .......... H01L 27/11502; H01L 27/2418; H01L 27/2463; H01L 45/00; H01L 45/08; H01L 45/1233; H01L 45/1253; H01L 45/146; H01L 45/147; H01L 45/1616; H01L 45/1625; H01L 27/11507; H01L 28/55; G11C 11/22; G11C 13/0069; G11C 2213/54

See application file for complete search history.

(56) References Cited

U.S. PATENT DOCUMENTS

| 6,577,529 B1 * | 6/2003 | Sharma .................... G11C 11/15 365/158 |
| 7,759,713 B2 | 7/2010 | Kalinin et al. |
| 9,053,801 B2 | 6/2015 | Sandhu et al. |
| 2014/0043895 A1 * | 2/2014 | Bibes ...................... H01L 43/08 365/171 |
| 2015/0364536 A1 * | 12/2015 | Bibes ................... H01L 29/8615 257/421 |
| 2017/0345868 A1 * | 11/2017 | Apalkov ............... H01L 27/222 |

* cited by examiner

*Primary Examiner* — Shahed Ahmed

(57) ABSTRACT

A ferroelectric memory device includes a first electrode layer disposed on a substrate, a first tunnel barrier layer disposed on the first electrode layer, a second electrode layer disposed on the first tunnel barrier layer, a second tunnel barrier layer disposed on the second electrode layer, and a third electrode layer disposed on the second tunnel barrier layer. Any one of the first and second tunnel barrier layers includes a ferroelectric material.

9 Claims, 9 Drawing Sheets

FERROELECTRIC MEMORY DEVICE AND CROSS-POINT ARRAY APPARATUS INCLUDING THE SAME

CROSS-REFERENCE TO RELATED APPLICATION

The present application claims priority under 35 U.S.C. 119(a) to Korean Patent Application No. 10-2017-0032719, filed on Mar. 15, 2017, which is herein incorporated by reference in its entirety.

BACKGROUND

1. Technical Field

Embodiments of the present disclosure relate to a ferroelectric memory device and a cross-point array apparatus including the same.

2. Related Art

Generally, a ferroelectric material is a material having a spontaneous electrical polarization in the absence of an applied external electric field. More specifically, a ferroelectric material can maintain one of two stable remanent polarization states. Thus, a ferroelectric material may be utilized to store digital information in a nonvolatile manner. For example, binary information "0" or "1" may be stored in remanent polarization states.

Remanent polarization in a ferroelectric material can be reversibly switched by an externally applied electric field. The application of ferroelectric materials in nonvolatile memory devices has been actively studied. As an exemplary application, a memory device can include a unit cell structure having one transistor and one capacitor and employ a ferroelectric material layer as a dielectric layer of the capacitor. As another exemplary application, a memory device can include a unit cell structure having one transistor and employ a ferroelectric material layer as a gate dielectric layer of the transistor.

SUMMARY

An embodiment of the present disclosure provides a nonvolatile memory device that stores information using a ferroelectric material in a cross-point array apparatus.

A ferroelectric memory device, according to an aspect of the present disclosure, includes a first electrode layer disposed on a substrate, a first tunnel barrier layer disposed on the first electrode layer, a second electrode layer disposed on the first tunnel barrier layer, a second tunnel barrier layer disposed on the second electrode layer, and a third electrode layer disposed on the second tunnel barrier layer. Any one of the first and second tunnel barrier layers may include a ferroelectric material.

A cross-point array apparatus, according to another aspect of the present disclosure, includes a pillar-shaped structure disposed in a region where a first conductive line and a second conductive line intersect. The pillar-shaped structure may include a first tunnel barrier layer, an intermediate electrode layer and a second tunnel barrier layer. Any one of the first and second tunnel barrier layers may include a ferroelectric material. A logic signal information may be stored in a nonvolatile manner in the pillar-shaped structure according to an orientation of remanent polarization of the ferroelectric material in the any one of the first and second tunnel barrier layers.

DETAILED DESCRIPTION

Figure 1:
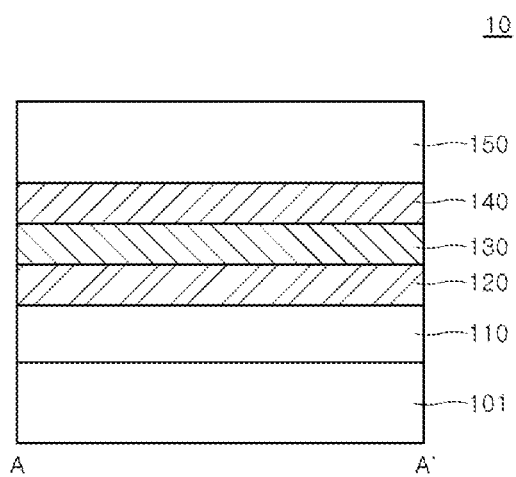
FIG. 1 is a cross-sectional view schematically illustrating the ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have" or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

A program operation or an erase operation of a ferroelectric memory device herein may mean an operation changing an orientation of a remanent polarization in a ferroelectric material. When the orientation of a remanent polarization is changed, an electron accumulation region and an electron depletion region may be alternately formed in an electrode layer in contact with a tunnel barrier layer having the ferroelectric material.

A read operation of a ferroelectric memory device herein may mean an operation that applies a voltage that does not change the orientation of a remanent polarization in the ferroelectric memory device, and that reads a differentiated tunneling current from the ferroelectric memory device.

FIG. 1 is a cross-sectional view schematically illustrating a ferroelectric memory device 10 according to an embodiment of the present disclosure. Referring to FIG. 1, the ferroelectric memory device 10 may include a first electrode layer 110, a first tunnel barrier layer 120, a second electrode layer 130, a second tunnel barrier layer 140, and a third electrode layer 150 that are sequentially disposed on a substrate 101. In an embodiment, any one of the first and second tunnel barrier layers 120 and 140, respectively, may include a ferroelectric material. As an example, the first tunnel barrier layer 120 may include a ferroelectric material, and the second tunnel barrier layer 140 may include a non-ferroelectric metal oxide. As another example, the first tunnel barrier layer 120 may include a non-ferroelectric metal oxide, and the second tunnel barrier layer 140 may include a ferroelectric material.

The substrate 101 may, for example, be a semiconductor substrate, an insulation substrate or a conductive substrate. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate, as non-limiting examples. The substrate 101 may, in other non-limiting examples, be a sapphire substrate, a quartz substrate, or a glass substrate. The substrate 101 may, in further non-limiting examples, be a doped semiconductor substrate or a conductor substrate.

The first electrode layer 110 may be disposed on the substrate 101. The first electrode layer 110 may include doped silicon, or a conductive metal oxide. The first electrode layer 110 may include doped silicon, a ruthenium oxide ($RuO_2$), an iridium oxide ($IrO_2$), a niobium-doped strontium titanium oxide (Nb-doped $SrTiO_3$, Nb:STO), a lanthanum strontium manganese oxide ($La_{0.7}Sr_{0.3}MnO_3$), a lanthanum calcium manganese oxide ($La_{0.5}Ca_{0.5}MnO_3$), or a combination of two or more thereof, as non-limiting examples. The first electrode layer 110 may include a material having a lower conductive carrier density than that of conventional metals. The first electrode layer 110 may be formed using a chemical vapor deposition method, an atomic layer deposition method, a sputtering method, or the like, as non-limiting examples.

In an embodiment, the first electrode layer 110 may be in contact with the first tunnel barrier layer 120, which may include a ferroelectric material having a remanent polarization. Due to the remanent polarization, an electron accumulation region or an electron depletion region may be formed, extending from an interface between the first tunnel barrier layer 120 and the first electrode layer 110 to an inner region of the first electrode layer 110.

The first tunnel barrier layer 120 may be disposed on the first electrode layer 110. The first tunnel barrier layer 120 may include a ferroelectric material having a remanent polarization. The ferroelectric material may, for example, include a hafnium oxide, a zirconium oxide, or a perovskite-based material. The ferroelectric material may include $HfO_2$, $ZrO_2$, $Hf_{0.5}Zr_{0.5}O_2$, $PbZr_xTi_{1-x}O_3$ (0<x<1, PZT), Ba(Sr,Ti)$O_3$ (BST), $BaTiO_3$ (BTO), $Bi_{4-x}La_xTi_3O_{12}$ (0<x<1, BLT), $SrBi_2Ta_2O_9$ (SBT), $BiFeO_3$, $Pb_5Ge_5O_{11}$ (PGO), $SrBi_2Nb_2O_9$ (SBN), $YMnO_3$ or a combination of two or more thereof, as non-limiting examples.

In an embodiment, the first tunnel barrier layer 120 may include a ferroelectric material doped with a dopant. For example, the first tunnel barrier layer 120 may include a doped hafnium oxide, a doped zirconium oxide, a doped hafnium zirconium oxide, or a combination of two or more thereof. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), lanthanum (La), or a combination of two or more thereof, by way of non-limiting examples.

In an embodiment, the first tunnel barrier layer 120 may be formed using a chemical vapor deposition method, an atomic layer deposition method, or the like. In an embodiment, the first tunnel barrier layer 120 may have a thickness of about 5 nanometers (nm) to about 20 nm. A remanent polarization formed in the first tunnel barrier layer 120 may induce electrons in an inner region of the first electrode layer 110 extending from an interface between the first tunnel barrier layer 120 and the first electrode layer 110 into the inner region. The inner region having the induced electrons may have a predetermined thickness. The induced electrons form an accumulation region of electrons or a depletion region of electrons in the first electrode layer 110.

The second electrode layer 130 may be disposed on the first tunnel barrier layer 120. The second electrode layer 130 may, for example, include a metal or a conductive metal nitride. The second electrode layer 130 may include tungsten (W), titanium (Ti), copper (Cu), aluminum (Al), ruthenium (Ru), platinum (Pt), iridium (Ir), tungsten nitride, titanium nitride, tantalum nitride, or a combination of two or more thereof, as non-limiting examples.

In an embodiment, depending on the orientation of a remanent polarization in the first tunnel barrier layer 120, an accumulation region of electrons may be induced in the inner region of the first electrode layer 110, and holes may be induced in the second electrode layer 130. In some instances, the second electrode layer 130 may have a sufficiently high electron density to be able to recombine and to offset any induced holes such that an accumulation region of induced holes is not formed in the second electrode layer 130. In another embodiment, with a different orientation of the remanent polarization in the first tunnel barrier layer 120, holes may be induced in the inner region of the first electrode layer 110 and electrons may be induced in the second electrode layer 130. In some cases, the second electrode layer 130 may have an electron density sufficiently higher than that of the induced electrons such that an accumulation region of induced electrons is not formed in the second electrode layer. Accordingly, in various embodiments disclosed herein, an accumulation region of induced holes or the induced electrons might not be formed in a second electrode layer 130 in contact with a first tunnel barrier layer 120.

In an embodiment, the second electrode layer 130 may be formed using a chemical vapor deposition method, an atomic layer deposition method, a physical vapor deposition method, or the like as non-limiting examples. For example, the physical vapor deposition method may include a sputtering, an vaporation, or a molecular beam deposition.

The second tunnel barrier layer 140 may be disposed on the second electrode layer 130. When the first tunnel barrier layer 120 includes ferroelectric material, the second tunnel barrier layer 140 may include a non-ferroelectric metal oxide. The non-ferroelectric metal oxide may include a tantalum oxide ($Ta_2O_5$), a titanium oxide ($TiO_2$), an aluminum oxide ($Al_2O_3$), a zinc oxide (ZnO), or a combination of two or more thereof, as non-limiting examples.

In an embodiment, in a read operation of a ferroelectric memory device, tunneling electrons may flow into the second tunnel barrier layer 140 after passing through the first tunnel barrier layer 120. In an example, if tunneling electrons have a low electron density similar to that of a leakage current level, then the second tunnel barrier layer 140 may block low density tunneling electrons from passing through the second tunnel barrier layer 140. In another example, when tunneling electrons have a relatively high electron density, then tunneling electrons may be impact ionized while passing through the second tunnel barrier layer 140, thereby increasing the density of the tunneling electrons and increasing the tunneling current in the ferroelectric memory device operation.

In an embodiment, the second tunnel barrier layer 140 may be formed using a chemical vapor deposition method, an atomic layer deposition method, or the like, as non-limiting examples. The second tunnel barrier layer 140 may have a thickness of about 2 nm to about 10 nm.

The third electrode layer 150 may be disposed on the second tunnel barrier layer 140. The third electrode layer 150 may, for example, include a metal or a conductive metal nitride. The third electrode layer 150 may include tungsten (W), titanium (Ti), copper (Cu), aluminum (Al), ruthenium (Ru), platinum (Pt), iridium (Ir), a tungsten nitride, a titanium nitride, a tantalum nitride, or a combination of two or more thereof, as non-limiting examples.

In embodiments, when the substrate 101 is not an insulative substrate, an insulation layer (not illustrated) may be disposed between the substrate 101 and the first electrode layer 110. The insulation layer may include a silicon oxide, a silicon nitride, a silicon oxynitride, or an aluminum oxide as non-limiting examples.

In an embodiment, the first tunnel barrier layer 120 may include a non-ferroelectric metal oxide, and the second tunnel barrier layer 140 may include a ferroelectric material. Depending on the orientation of a remanent polarization in the second tunnel barrier layer 140, an accumulation region of electrons or a depletion region of electrons may be formed in an inner region of the third electrode layer 150 extending from an interface between the second tunnel barrier layer 140 and the third electrode layer 150 into the inner region. The inner region having the induced electrons may have a predetermined thickness. The third electrode layer 150 may include doped silicon, a conductive metal oxide, or a material having a lower density of conductive carrier than a conventional metal. The third electrode layer 150 may include doped silicon, a ruthenium oxide ($RuO_2$), an iridium oxide ($IrO_2$), a niobium-doped strontium titanium oxide (Nb-doped $SrTiO_3$, Nb:STO), a lanthanum strontium manganese oxide ($La_{0.7}Sr_{0.3}MnO_3$), a lanthanum calcium manganese oxide ($La_{0.5}Ca_{0.5}MnO_3$), or a combination of two or more thereof, as non-limiting examples. In embodiments, the first electrode layer 110 may, as non-limiting examples, include tungsten (W), titanium (Ti), copper (Cu), aluminum (Al), ruthenium (Ru), platinum (Pt), iridium (Ir), a tungsten nitride, a titanium nitride, a tantalum nitride, or a combination of two or more thereof, and the first electrode layer 110 may be disposed to contact the first tunnel barrier layer 120, which includes a non-ferroelectric metal oxide.

Figure 2:
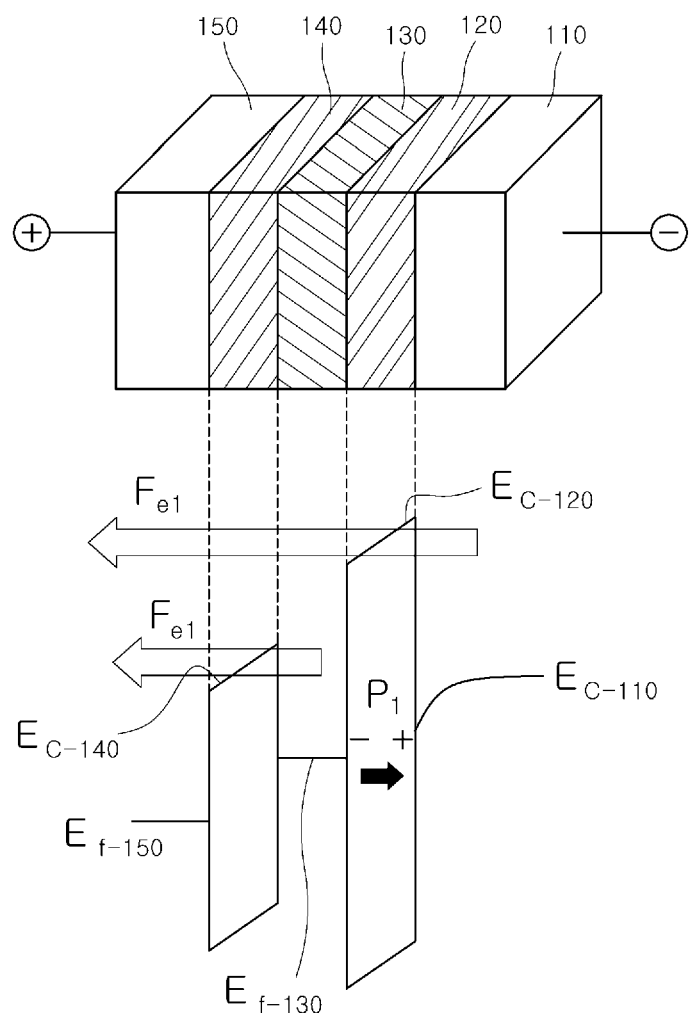
FIG. 2 is a view schematically illustrating a program operation of a ferroelectric memory device according to an embodiment of the present disclosure.
Figure 3:
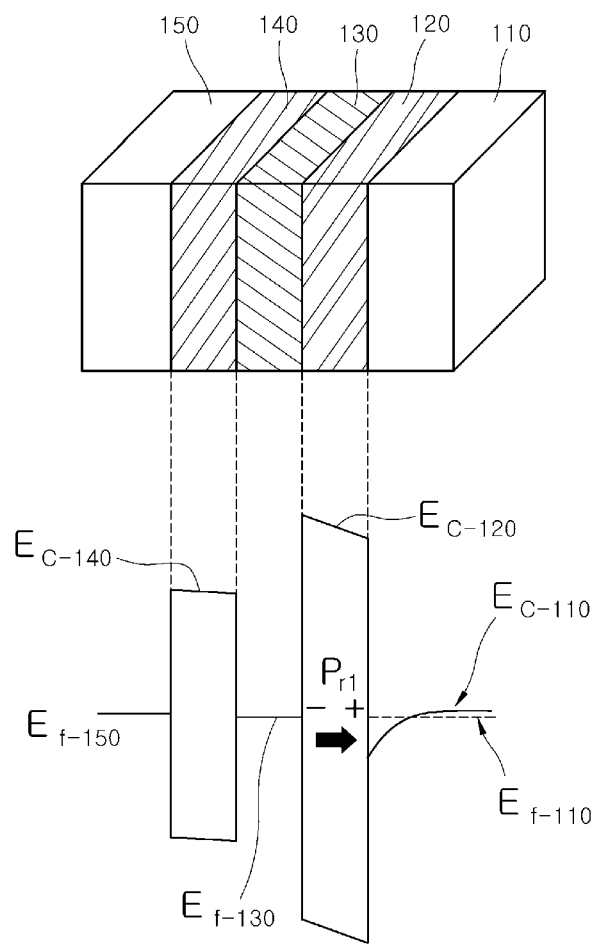
FIG. 3 is a view schematically illustrating a state in which a first logic signal information is stored in a ferroelectric memory device as a result of a program operation according to an embodiment of the present disclosure.

FIG. 2 is a view schematically illustrating a program operation of a ferroelectric memory device according to an embodiment of the present disclosure. FIG. 3 is a view schematically illustrating a state in which a first logic signal information is stored in the ferroelectric memory device as a result of the program operation according to an embodiment of the present disclosure. The ferroelectric memory device illustrated in FIGS. 2 and 3 is substantially the same as the ferroelectric memory device 10 of the embodiment described above and with reference to FIG. 1. Substrate 101 is omitted, however, from the schematic illustrations in FIGS. 2 and 3.

Referring to FIG. 2, in an embodiment, a program operation may be performed by applying a predetermined program voltage from the first electrode layer 110 through the third electrode layer 150 of a ferroelectric memory device. Application of the program voltage may be performed by applying a relatively positive bias to the third electrode layer 150 while grounding the first electrode layer 110. Alternatively, application of the program voltage may be performed by applying a relatively negative bias to the first electrode layer 110 while grounding the third electrode layer 150.

As illustrated in FIG. 2, the program voltage may form a polarization $P_1$ oriented in the first tunnel barrier layer 120 in a negative to positive direction towards to the first electrode layer 110. In addition, the program voltage may change an energy band diagram so that an energy level of electrons is in a decreasing order from a conduction band energy level $E_{c-110}$ in the first electrode layer 110, to a Fermi energy level $E_{f-130}$ of the second electrode layer 130, and to a Fermi energy level $E_{f-150}$ of the third electrode layer 150. That is, the energy level of electrons is highest in the conduction band energy level $E_{c-110}$ of the first electrode layer 110, and is lowest in the Fermi energy level $E_{f-150}$ of the third electrode layer 150 in the band diagram of FIG. 2.

Accordingly, tunneling of electrons can be generated from the first electrode layer 110 to the third electrode layer 150 via the first tunnel barrier layer 120, the second electrode layer 130, and the second tunnel barrier layer 140. In an example, as illustrated in FIG. 2, the conduction bands $E_{c-120}$ and $E_{c-140}$ of the first tunnel barrier layer 120 and the second tunnel barrier layer 140, respectively, are bent by the program voltage, and electrons pass through the first tunnel barrier layer 120 and the second tunnel barrier layer 140 with reduced tunneling paths. Fowler-Nordheim (F-N) tunneling $F_{e1}$ of electrons may occur.

As illustrated in FIG. 3, in an embodiment, after the program voltage is eliminated, a remanent polarization $P_{r1}$ with the same orientation as that of the polarization $P_1$ may be distributed in the first tunnel barrier layer 120. The remanent polarization $P_{r1}$ can affect electrons in an inner region of the first electrode layer 110 adjacent to an interface between the first tunnel barrier layer 120 and the first electrode layer 110. For example, electrons in the inner region of the first electrode layer 110 may be induced to form an electron accumulation region in the first electrode layer 110 adjacent to the interface. In an embodiment, as illustrated in FIG. 3, due to the electron accumulation region, at least a portion of energy level $E_{c-110}$ of the conduction band of the first electrode layer 110 may be lowered to a level lower than the Fermi energy level $E_{f-110}$ of the first electrode layer 110 in a region adjacent to the interface between the first tunnel barrier layer 120 and the first electrode layer 110.

As described above, after the program voltage is eliminated, a remanent polarization may be oriented in a negative to positive direction towards the first tunnel barrier layer 120 in the first electrode layer 110, and an electron accumulation region may be formed in the first electrode layer 110. Information corresponding to such a state can be stored in a nonvolatile manner as a first logic signal information.

In an embodiment, a read voltage may have the same polarity as that of the program voltage as shown in FIG. 2. The read voltage may be applied to a ferroelectric memory device having a first logic signal information stored in a nonvolatile manner. The read voltage may be selected such that the orientation of the remanent polarization $P_{r1}$ formed in the first tunnel barrier layer 120 of FIG. 3 does not change. The read voltage may be smaller than the program voltage.

When the read voltage is applied, tunneling of electrons may occur from the first electrode layer 110 to the third electrode layer 150. A relatively high electron density distributed in the electron accumulation region in the first electrode layer 110 may increase the efficiency of tunneling of the electrons through the first tunnel barrier layer 120. For example, tunneling electrons of relatively high density passing through the first tunnel barrier layer 120 may further increase the tunneling current with impact ionization occurring in the second tunnel barrier layer 140. When a relatively large tunneling current is measured, information stored in the ferroelectric memory device can be read as the first logic signal information.

Figure 4:
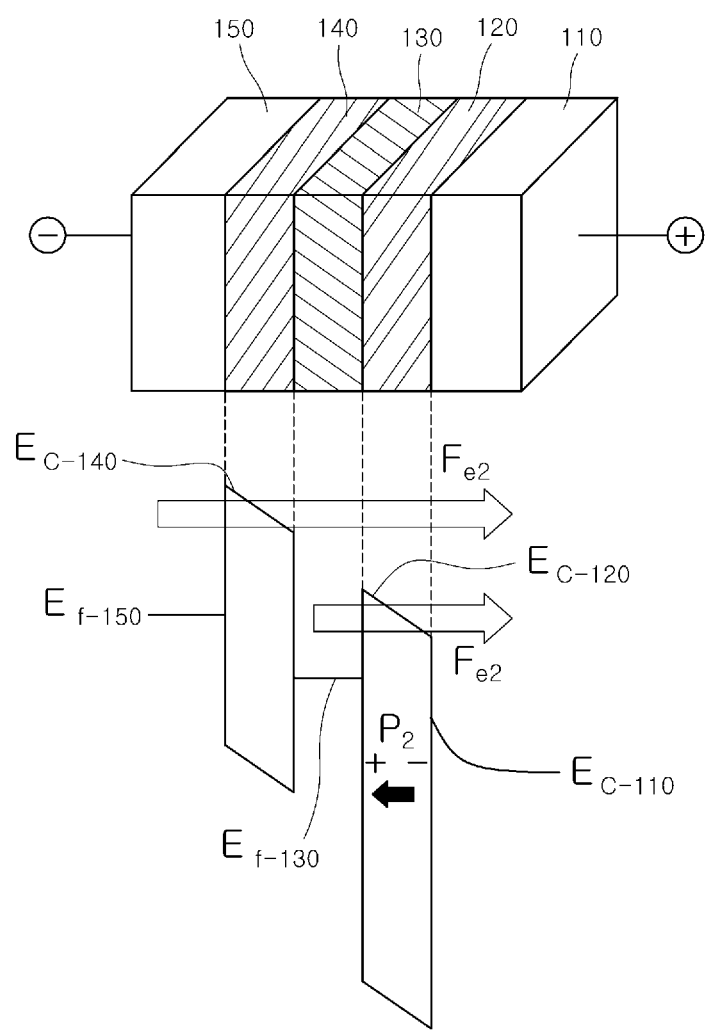
FIG. 4 is a view schematically illustrating an erase operation of a ferroelectric memory device according to an embodiment of the present disclosure.
Figure 5:
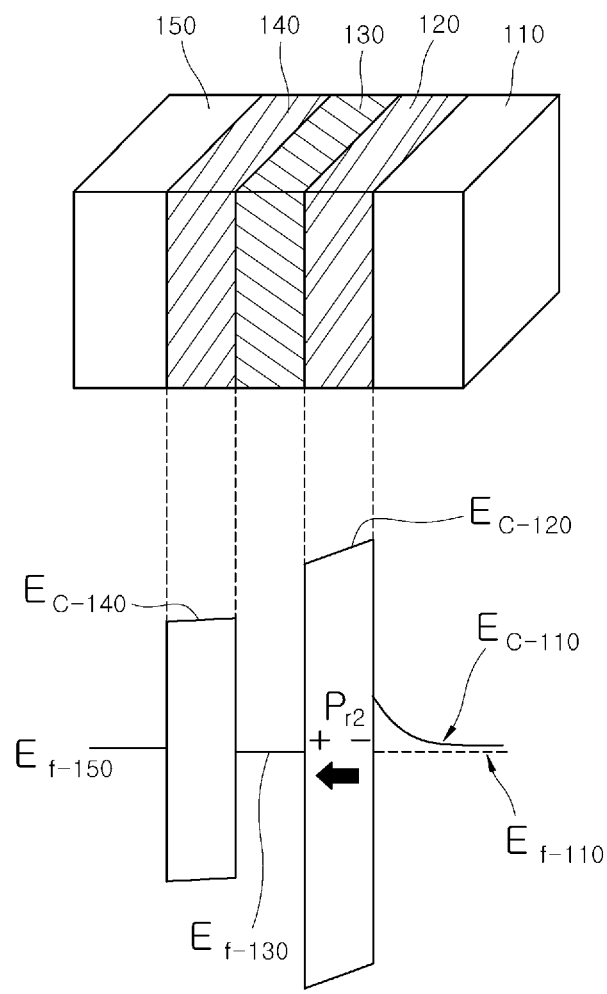
FIG. 5 is a view schematically illustrating a state in which a second logic signal information is stored in a ferroelectric memory device as a result of an erase operation according to an embodiment of the present disclosure.

FIG. 4 is a view schematically illustrating an erase operation of a ferroelectric memory device according to an embodiment of the present disclosure. FIG. 5 is a view schematically illustrating a state in which a second logic signal information is stored in a ferroelectric memory device as a result of an erase operation according to an embodiment of the present disclosure. The ferroelectric memory device illustrated in FIGS. 4 and 5 is substantially the same as the ferroelectric memory device 10 of the embodiment described above and with reference to FIG. 1. Substrate 101 is omitted, however, from the schematic illustrations in FIGS. 4 and 5.

Referring to FIG. 4, in an embodiment, an erase operation may be performed by applying a predetermined erase voltage from the first electrode layer 110 through the third electrode layer 150 of a ferroelectric memory device. Application of the erase voltage may be performed by applying a relatively negative bias to the third electrode layer 150 while grounding the first electrode layer 110. Alternatively, application of the erase voltage may be performed by applying a relatively positive bias to the first electrode layer 110 while grounding the third electrode layer 150.

As illustrated in FIG. 4, the erase voltage may form a polarization $P_2$ oriented in the first tunnel barrier layer 120 in a negative to positive direction towards to the second electrode layer 130. In addition, the erase voltage can change the energy band diagram so that the energy level of electrons is in a decreasing order from a Fermi energy level $E_{f\text{-}150}$ of the third electrode layer 150, to a Fermi energy level $E_{f\text{-}130}$ of the second electrode layer 130, and to a conduction band energy level $E_{c\text{-}110}$ of the first electrode layer 110. That is, the energy level of electrons is highest in the Fermi energy level $E_{f\text{-}150}$ of the third electrode layer 150, and is lowest in conduction band energy level $E_{c\text{-}110}$ of the first electrode layer 110 among those of the first to third electrode layers in the band diagram of FIG. 4.

Accordingly, tunneling of electrons may be generated from the third electrode layer 150 to the first electrode layer 110 via the second tunnel barrier layer 140, the second electrode layer 130, and the first tunnel barrier layer 120. In an example, as illustrated in FIG. 4, the conduction bands $E_{c\text{-}120}$ and $E_{c\text{-}140}$ of the first tunnel barrier layer 120 and the second tunnel barrier layer 140, respectively, are bent due to the erase voltage, and electrons pass through the first tunnel barrier layer 120 and the second tunnel barrier layer 140 with reduced tunneling paths. F-N tunneling $F_{e2}$ of the electrons may occur.

As illustrated in FIG. 5, in an embodiment, after the erase voltage is eliminated, a remanent polarization $P_{r2}$ with the same orientation as that of the polarization $P_2$ may be distributed in the first tunnel barrier layer 120. The remanent polarization $P_{r2}$ may induce holes in an inner region of the first electrode layer 110 adjacent to an interface between the first tunnel barrier layer 120 and the first electrode layer 110. For example, holes induced in the inner region of the first electrode layer 110 may form a hole accumulation region in the first electrode layer 110 adjacent to the interface.

As illustrated in FIG. 5, in an embodiment, due to hole accumulation in an inner region of the first electrode layer 110, the energy level $E_{c\text{-}110}$ of the conduction band of the first electrode layer 110 may form an electron depletion region in a region adjacent to an interface between the first tunnel barrier layer 120 and the first electrode layer 110. Accordingly, in the region where the electron depletion region is formed, at least a portion of the energy level $E_{c\text{-}110}$ of the conduction band of the first electrode layer 110 may be located above the Fermi energy level $E_{f\text{-}110}$, and the difference between the conduction band energy level $E_{c\text{-}110}$ and the Fermi energy level $E_{f\text{-}110}$ may exhibit a tendency to increase as the interface is approached.

As described above, after the erase voltage is eliminated, a remanent polarization is oriented in the first tunnel barrier layer 120 in a negative to positive direction towards second electrode layer 130, and an electron depletion region may be formed in the first electrode layer 110. Information corresponding to such a state can be stored in a nonvolatile manner as a second logic signal information.

In an embodiment, a read voltage may be applied to a ferroelectric memory device having a second logic signal information stored in a nonvolatile manner. The read voltage may have the same polarity as that of the program voltage as shown in FIG. 2. The read voltage may have an absolute value smaller than a program voltage, and the program voltage may have an orientation opposite to that of the erase voltage. In addition, the read voltage may be selected such that the orientation of the remanent polarization $P_{r2}$ formed in the first tunnel barrier layer 120 does not change.

When the read voltage is applied, tunneling of electrons may occur from the first electrode layer 110 to the third electrode layer 150. A relatively low electron density distributed in the electron depletion region in the first electrode layer 110 may decrease the efficiency of tunneling through the first tunnel barrier layer 120. For example, tunneling electrons passing through the first tunnel barrier layer 120 may have a small current density similar to that of a leakage current level. The second tunnel barrier layer 140 may block tunneling electrons with a relatively low electron density from conducting through the second tunnel barrier layer 140.

As described above, according to an embodiment of the present disclosure, there is provided a ferroelectric memory device having a first and a second tunnel barrier layers stacked on a substrate and spaced apart from each other. The first or the second tunnel barrier layer may include a ferroelectric material having a remanent polarization. According to the orientation of the remanent polarization, an electron accumulation region or an electron depletion region may be formed in an electrode layer in contact with the tunnel barrier layer having the ferroelectric material.

In an embodiment, the orientation of the remanent polarization of the ferroelectric material can be controlled by applying a program voltage or an erase voltage to the ferroelectric memory device. As a result, an electron accumulation region or an electron depletion region, respectively, may be formed according to the orientation of the remanent polarization in an electrode layer in contact with the tunnel barrier layer having the ferroelectric material. A first logic signal information or a second logic signal information corresponding to the orientation of the remanent polarization after a program or an erase operation can be stored in the ferroelectric memory device in a nonvolatile manner.

In addition, a read voltage may be applied to a ferroelectric memory device in which a first logic signal information or a second logic signal information are stored, and a tunneling current generated through the first and second tunnel barrier layers may be measured to read out the first logic signal information or the second logic signal information. In this embodiment, by blocking or amplifying the tunneling current at the time of reading the first or the second logic signal information through the first and second tunnel barrier layers, the sensing margin between the signal information can be effectively increased and the first and the second logic signal information are effectively differentiated from each other.

Figure 6:
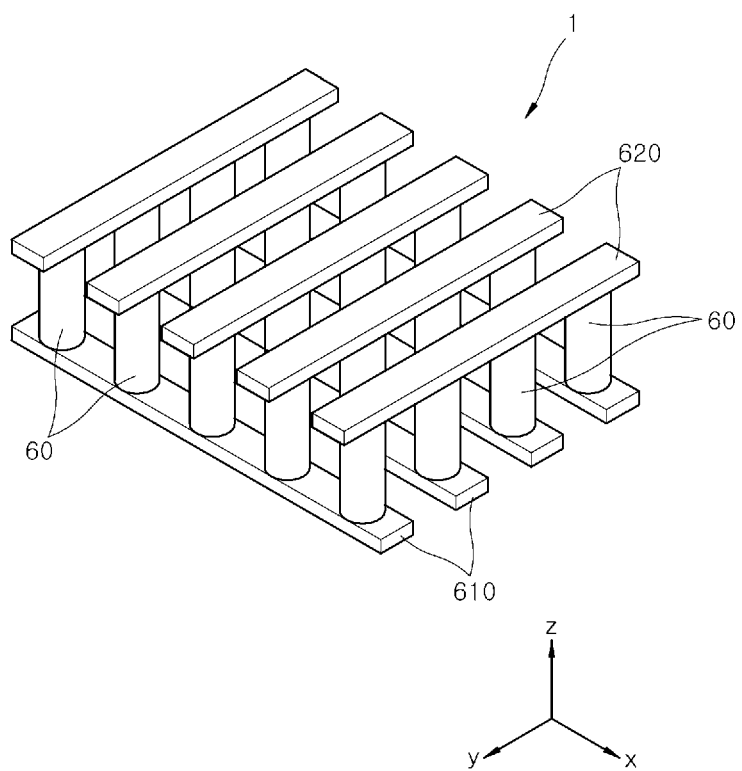
FIG. 6 is a perspective view schematically illustrating a cross-point array apparatus according to an embodiment of the present disclosure.
Figure 7:
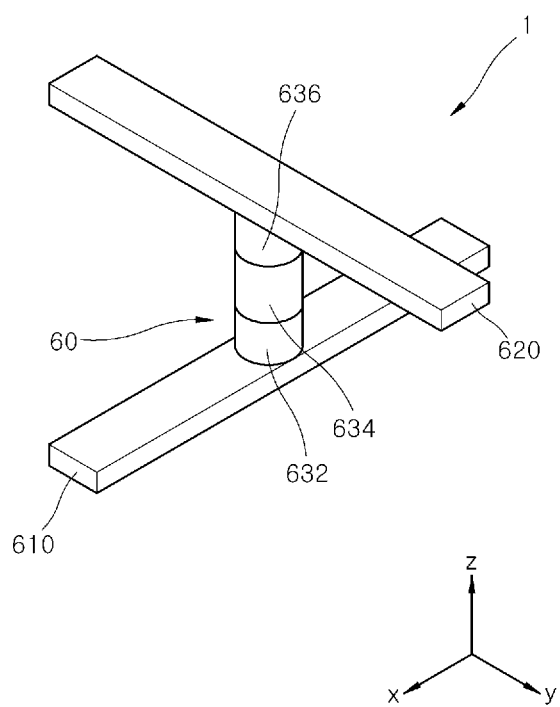
FIG. 7 is a perspective view schematically illustrating a portion of the cross-point array apparatus of FIG. 6.

FIG. 6 is a perspective view schematically illustrating a cross-point array apparatus according to an embodiment of the present disclosure. FIG. 7 is a partially enlarged view of the cross-point array apparatus 1 of FIG. 6.

Referring to FIG. 6, in an embodiment, a cross-point array apparatus 1 may include first conductive lines 610 arranged in an x-direction, second conductive lines 620 arranged in a y-direction, and pillar-shaped structures 60 disposed along a z-direction in regions where the first conductive lines 610 and the second conductive lines 620 intersect. The pillar-shaped structures 60 may constitute a plurality of arrays along the x-direction and the y-direction. Although the illustrations in FIGS. 6 and 7 show a rectangular coordinate system in which the x-direction, the y-direction and the z-direction are orthogonal to each other, the present disclosure is not limited to a rectangular coordinate system. As long as the x-direction and the y-direction are not parallel, various configurations may exist.

Referring to FIG. 7, each of the pillar-shaped structures 60 may include a first tunnel barrier layer 632, an intermediate electrode layer 634, and a second tunnel barrier layer 636. The first tunnel barrier layer 632 may contact a first conductive line 610 and the second tunnel barrier layer 636 may contact a second conductive line 620.

In an embodiment, the first tunnel barrier layer 632 may include a ferroelectric material. A configuration of the first tunnel barrier layer 632 may be substantially the same as a configuration of a first tunnel barrier layer 120 of an embodiment described above and with reference to FIGS. 1 to 5. The first conductive line 610 may include a material having a low conductive carrier density as compared to conventional metals. The first conductive line 610 may have an electron accumulation region or an electron depletion region in an interface region in contact with the first tunnel barrier layer 632, depending on the orientation of a remanent polarization of the ferroelectric material. The first conductive line 610 may, for example, include doped silicon, a ruthenium oxide ($RuO_2$), an iridium oxide ($IrO_2$), a niobium-doped strontium titanium oxide (Nb-doped $SrTiO_3$, Nb:STO), a lanthanum strontium manganese oxide ($La_{0.7}Sr_{0.3}MnO_3$), a lanthanum calcium manganese oxide ($La_{0.5}Ca_{0.5}MnO_3$), or a combination of two or more thereof, as non-limiting examples.

In an embodiment, the configuration of the intermediate electrode layer 634 may be substantially the same as a configuration of a second electrode layer 130 described above and with reference to FIGS. 1 to 5. The intermediate electrode layer 634 may, for example, include a metal or a conductive metal nitride. Accordingly, an accumulation region or depletion region of the induced electrons might not be formed in the intermediate electrode layer 634 in contact with the first tunnel barrier layer 632.

In an embodiment, a second tunnel barrier layer 636 may be disposed between a second conductive line 620 and an intermediate electrode layer 634. The second tunnel barrier layer 636 may include a non-ferroelectric metal oxide. A configuration of the second tunnel barrier layer 636 may be substantially the same as a configuration of a second tunnel barrier layer 140 described above and with reference to FIGS. 1 to 5.

The second conductive line 620 may, for example, include tungsten (W), titanium (Ti), copper (Cu), aluminum (Al), ruthenium (Ru), platinum (Pt), iridium (Ir), a tungsten nitride, a titanium nitride, a tantalum nitride, or a combination of two or more thereof, as non-limiting examples.

In an embodiment, a logic signal information may be stored in a nonvolatile manner and may be read depending on an accumulation region or a depletion region of induced electrons in a first conductive line 610. The accumulation region or the depletion region of induced electrons may be formed according to the orientation of a remanent polarization in a first tunnel barrier layer 632 of a pillar-shaped structure 60.

For example, a logic signal information stored in a nonvolatile manner can be read out using an amount of tunneling current passing through the pillar-shaped structure corresponding to each memory cell in response to a read voltage that does not reverse the remanent polarization of the memory cell. Accordingly, the logic signal information can remain in the cell even after reading the logic signal information. This can be contrasted with a phenomenon, in a conventional capacitor-type ferroelectric memory device, in which logic signal information stored in a cell is erased by reversing the remanent polarization stored in the cell when reading the logic signal information.

Figure 8:
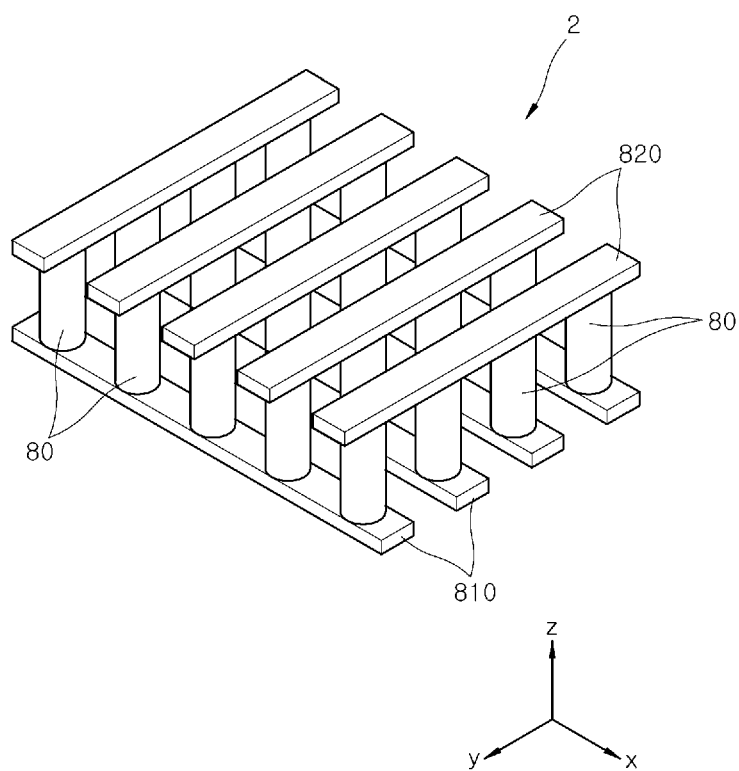
FIG. 8 is a perspective view schematically illustrating a cross-point array apparatus according to an embodiment of the present disclosure.
Figure 9:
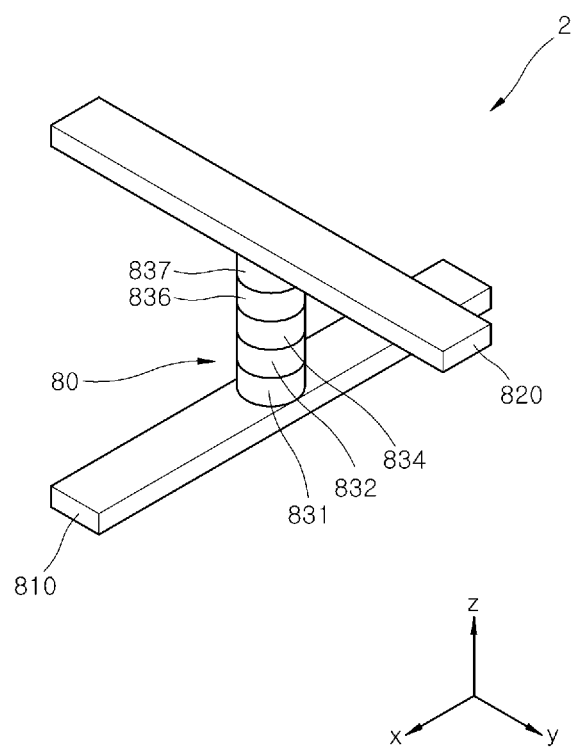
FIG. 9 is a perspective view schematically illustrating a portion of the cross-point array apparatus of FIG. 8.

FIG. 8 is a perspective view schematically illustrating a cross-point array apparatus according to an embodiment of the present disclosure. FIG. 9 is a partially enlarged view of the cross-point array apparatus 2 of FIG. 8.

Referring to FIG. 8, in an embodiment, a cross-point array apparatus 2 may include first conductive lines 810 arranged in an x-direction, second conductive lines 820 arranged in a y-direction, and pillar-shaped structures 80 disposed along a z-direction in regions where the first conductive lines 810 and the second conductive lines 820 intersect. The pillar-shaped structures 80 may constitute a plurality of arrays along the x-direction and the y-direction. Although the illustrations in FIGS. 8 and 9 show a rectangular coordinate system in which the x-direction, the y-direction and the z-direction are orthogonal to each other, the present disclosure is not limited to a rectangular coordinate system. As long as the x-direction and the y-direction are not parallel, various configurations may exist. Each of the first conductive lines 810 and each of the second conductive lines 820 may, for example, include tungsten (W), titanium (Ti), copper (Cu), aluminum (Al), ruthenium (Ru), platinum (Pt), iridium (Ir), a tungsten nitride, a titanium nitride, a tantalum nitride, or a combination of two or more thereof, as non-limiting examples.

Referring to FIG. 9, each of the pillar-shaped structures 80 may include a first tunnel junction electrode layer 831, a first tunnel barrier layer 832, an intermediate electrode layer 834, a second tunnel barrier layer 836, and a second tunnel junction electrode layer 837. The first tunnel junction electrode layer 831 may contact a first conductive line 810 and the second tunnel junction electrode layer 837 may contact a second conductive line 820.

In an embodiment, the first tunnel barrier layer 832 may include a ferroelectric material. A configuration of the first tunnel barrier layer 832 may be substantially the same as a configuration of a first tunnel barrier layer 120 of an embodiment described above and with reference to FIGS. 1 to 5.

The first tunnel junction electrode layer 831 may include a material having a low conductive carrier density as compared to conventional metals. The first junction electrode layer 831 may have an electron accumulation region or an electron depletion region in an interface region in contact with the first tunnel barrier layer 832, according to the orientation of a remanent polarization of the ferroelectric material. The first tunnel junction electrode layer 831 may, for example, include doped silicon, a ruthenium oxide ($RuO_2$), iridium oxide ($IrO_2$), a niobium-doped strontium titanium oxide (Nb-doped $SrTiO_3$, Nb:STO), a lanthanum strontium manganese oxide ($La_{0.7}Sr_{0.3}MnO_3$), a lanthanum calcium manganese oxide ($La_{0.5}Ca_{0.5}MnO_3$), or a combination of two or more thereof as non-limiting examples.

The intermediate electrode layer 834 may, for example, include a metal or a conductive metal nitride. In an embodiment, the configuration of an intermediate electrode layer 834 may be substantially the same as a configuration of a second electrode layer 130 described above and with reference to FIGS. 1 to 5. Accordingly, an accumulation region or depletion region of induced electrons might not be formed in the intermediate electrode layer 834 in contact with the first tunnel barrier layer 832.

In an embodiment, a second tunnel barrier layer 836 may be disposed between an intermediate electrode layer 834 and a second junction electrode layer 837. The second tunnel barrier layer 836 may include a non-ferroelectric metal oxide. A configuration of the second tunnel barrier layer 836 may be substantially the same as a configuration of a second tunnel barrier layer 140 described above and with reference to FIGS. 1 to 5.

In an embodiment, it is possible to store and read out logic signal information that depends on the formation of an accumulation region or a depletion region of induced electrons in a first tunnel junction electrode layer 831, which may result from a remanent polarization orientation in a first tunnel barrier layer 832 of a pillar-shaped structure 80.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A cross-point array apparatus comprising:
   a pillar-shaped structure, disposed in a region where a first conductive line and a second conductive line intersect, having a first tunnel barrier layer, an intermediate electrode layer and a second tunnel barrier layer,
   wherein any one of the first and second tunnel barrier layers comprises a ferroelectric material; and
   wherein a logic signal information is stored in a nonvolatile manner in the pillar-shaped structure according to an orientation of a remanent polarization of the ferroelectric material in the any one of the first and second tunnel barrier layers;
   wherein a first tunnel junction electrode layer is disposed between the first conductive line and the first tunnel barrier layer: and
   wherein a second tunnel junction electrode layer is disposed between the second conductive line and the second tunnel barrier layer.

2. The cross-point array apparatus of claim 1,
   wherein, when a predetermined read voltage is applied to the pillar-shaped structure, a tunneling current that is differentiated according to the orientation of the remanent polarization of the ferroelectric material is generated in the pillar-shaped structure.

3. The cross-point array apparatus of claim 2,
   wherein the ferroelectric material comprises at least one selected from the group consisting of $HfO_2$, $ZrO_2$, $Hf0.5Zr0.5O2$, $PbZrxTi1-xO3$ ($0<x<1$, PZT), $Ba(Sr,Ti)O3$ (BST), $BaTiO3$ (BTO), $Bi4-xLaxTi3O12$ ($0<x<1$, BLT), $SrBi2Ta2O9$ (SBT), $BiFeO3$, $Pb5Ge5O11$ (PGO), $SrBi2Nb2O9$ (SBN) and $YMnO3$.

4. The cross-point array apparatus of claim 1,
   wherein one of the first and second tunnel barrier layers comprises a non-ferroelectric metal oxide, and the other of the first and second tunnel barrier layers includes a ferroelectric material.

5. The cross-point array apparatus of claim 4,
   wherein the non-ferroelectric metal oxide comprises at least one selected from a tantalum oxide ($Ta2O5$), a titanium oxide ($TiO2$), an aluminum oxide ($Al2O3$), and a zinc oxide (ZnO).

6. The cross-point array apparatus of claim 1,
   wherein the first tunnel barrier layer comprises the ferroelectric material,
   the first conductive line and the first tunnel barrier layer are in contact with each other, and
   the first conductive line has an electron accumulation region or an electron depletion region depending on the orientation of the remanent polarization of the ferroelectric material.

7. The cross-point array apparatus of claim 1,
   wherein the first tunnel barrier layer comprises the ferroelectric material,
   the first tunnel junction electrode layer and the first tunnel barrier layer are in contact with each other, and
   the first tunnel junction electrode layer has an electron accumulation region or an electron depletion region depending on the orientation of the remanent polarization of the ferroelectric material.

8. The cross-point array apparatus of claim 7,
   wherein the first tunnel junction electrode layer comprises at least one selected from doped silicon, a ruthenium oxide ($RuO2$), an iridium oxide ($IrO2$), a niobium-doped strontium titanium oxide (Nb-doped $SrTiO3$, Nb:STO), a lanthanum strontium manganese oxide ($La0.7Sr0.3MnO3$), and a lanthanum calcium manganese oxide ($La0.5Ca0.5MnO3$).

9. The cross-point array apparatus of claim 8,
   wherein the intermediate electrode layer comprises at least one selected from tungsten (W), titanium (Ti), copper (Cu), aluminum (Al), ruthenium (Ru), platinum (Pt), iridium (Ir), a tungsten nitride, a titanium nitride, and a tantalum nitride.

* * * * *